United States Patent
Kase et al.

(10) Patent No.: US 9,991,466 B2
(45) Date of Patent: *Jun. 5, 2018

(54) ORGANIC EL DISPLAY PROVIDED WITH GEL-STATE ENCAPSULANT INCORPORATING A DESICCANT AND A HIGH MOLECULAR-WEIGHT MEDIUM

(71) Applicants: Japan Display Inc., Tokyo (JP); Panasonic Liquid Crystal Display Co., Ltd., Hyogo-ken (JP)

(72) Inventors: Satoru Kase, Mobara (JP); Yoshinori Ishii, Chiba (JP); Eiji Matsuzaki, Yokohama (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/285,997

(22) Filed: Oct. 5, 2016

(65) Prior Publication Data
US 2017/0092893 A1    Mar. 30, 2017

Related U.S. Application Data

(63) Continuation of application No. 14/491,380, filed on Sep. 19, 2014, now Pat. No. 9,484,551, which is a
(Continued)

(30) Foreign Application Priority Data
Mar. 31, 2008    (JP) ................. 2008-089996

(51) Int. Cl.
*H01L 51/50* (2006.01)
*H01L 51/52* (2006.01)
(Continued)

(52) U.S. Cl.
CPC ...... *H01L 51/5246* (2013.01); *H01L 51/5253* (2013.01); *H01L 51/5259* (2013.01);
(Continued)

(58) Field of Classification Search
CPC ............... H01L 51/5237–51/525; H01L 51/56
See application file for complete search history.

(56) References Cited

U.S. PATENT DOCUMENTS 6,692,610 B2    2/2004    Low et al.
7,097,527 B2    8/2006    Matsuoka
(Continued)

FOREIGN PATENT DOCUMENTS

EP    1014758 A2    6/2000
JP    51022739 A    2/1976
(Continued)

*Primary Examiner* — Mariceli Santiago
(74) *Attorney, Agent, or Firm* — Juan Carlos A. Marquez; Marquez IP Law Office, PLLC

(57) ABSTRACT

A sealing substrate is arranged to oppositely face an element substrate or which organic EL layers are formed in a matrix array with a sealing material sandwiched therebetween. A gel-state desiccant is filled in an inner space surrounded by the element substrate, the sealing substrate and the sealing material. Since the gel-state desiccant is in a gel state, the gel-state desiccant is flexibly filled in the inner space of the organic EL display device thus completely eliminating a gap. Since the inner space is filled with the gel-state desiccant, moisture hardly intrudes into the inner space from the outside and, at the same time, a mechanical strength of the organic EL display device is also enhanced.

19 Claims, 7 Drawing Sheets

Related U.S. Application Data continuation of application No. 13/067,967, filed on Jul. 12, 2011, now Pat. No. 8,858,287, which is a continuation of application No. 12/382,224, filed on Mar. 11, 2009, now Pat. No. 7,999,469.

(51) Int. Cl.
  *H01L 51/56* (2006.01)
  *H01L 27/32* (2006.01)

(52) U.S. Cl.
  CPC .......... *H01L 51/56* (2013.01); *H01L 27/3244* (2013.01); *H01L 51/5237* (2013.01); *H01L 2251/5315* (2013.01)

(56) References Cited

U.S. PATENT DOCUMENTS

| | | |
|---|---|---|
| 7,182,664 B2 | 2/2007 | Yanagawa |
| 7,792,489 B2 | 9/2010 | Hirakata et al. |
| 9,484,551 B2 * | 11/2016 | Kase .................. H01L 51/5237 |
| 2004/0084686 A1 | 5/2004 | Wang et al. |
| 2004/0191566 A1 | 9/2004 | Kikuchi et al. |
| 2006/0100299 A1 | 5/2006 | Malik et al. |
| 2007/0114521 A1* | 5/2007 | Hayashi .............. H01L 51/5253 257/40 |
| 2007/0152212 A1 | 7/2007 | Cho et al. |
| 2007/0222382 A1 | 9/2007 | Yamazaki et al. |
| 2008/0054795 A1 | 3/2008 | Ohmi |
| 2008/0266509 A1 | 10/2008 | Nishi et al. |
| 2008/0284331 A1 | 11/2008 | Hayashi |
| 2009/0153042 A1 | 6/2009 | Izumi |
| 2009/0200930 A1 | 8/2009 | Hayashi |
| 2010/0001634 A1 | 1/2010 | Fujita et al. |
| 2011/0052857 A1 | 3/2011 | Suzuki et al. |

FOREIGN PATENT DOCUMENTS

| | | |
|---|---|---|
| JP | 07-068125 | 3/1995 |
| JP | 09-330788 | 12/1997 |
| JP | 2001-068266 | 3/2001 |
| JP | 11236748 A | 3/2001 |
| JP | 2004-157517 | 6/2004 |
| JP | 2004-0192930 | 7/2004 |
| JP | 2004-281088 A | 10/2004 |
| JP | 2005-533919 | 10/2005 |
| JP | 2006-244978 | 9/2006 |
| WO | WO-2007-87281 A1 | 2/2007 |

* cited by examiner

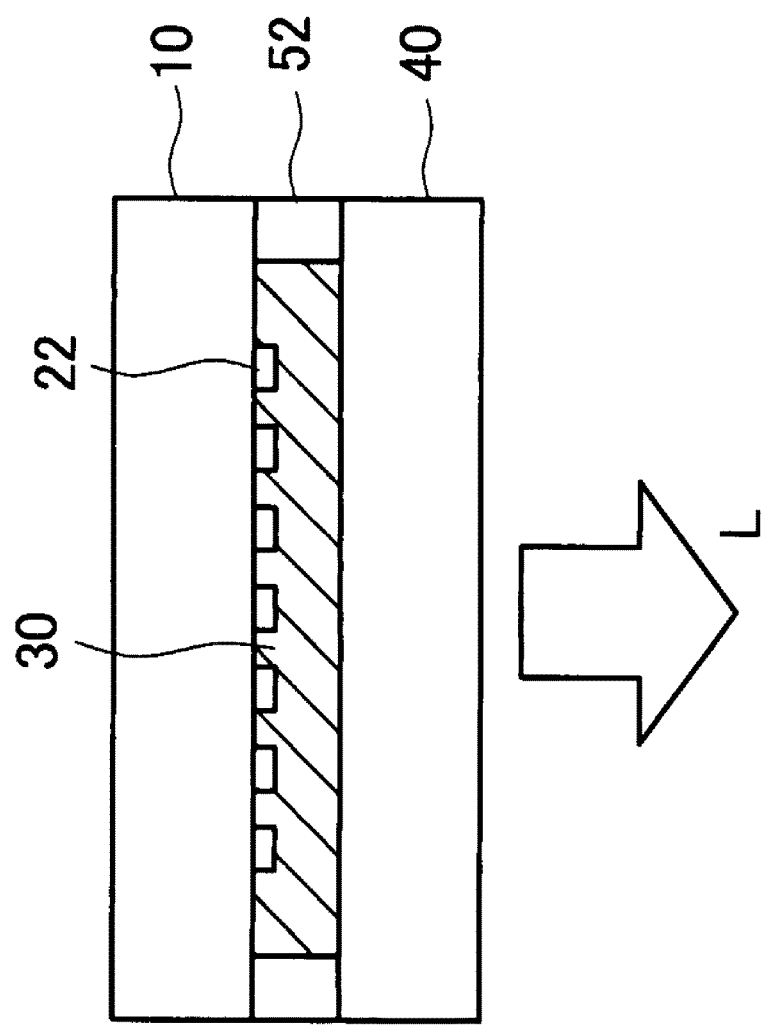

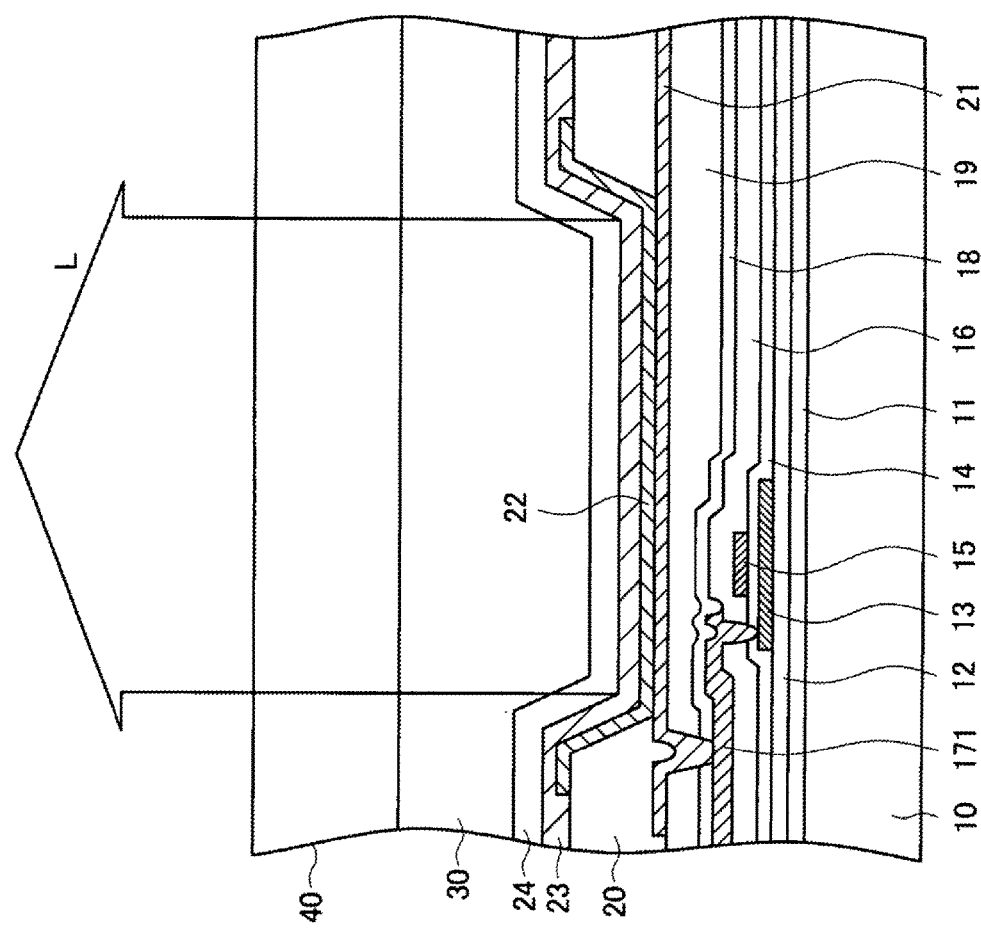

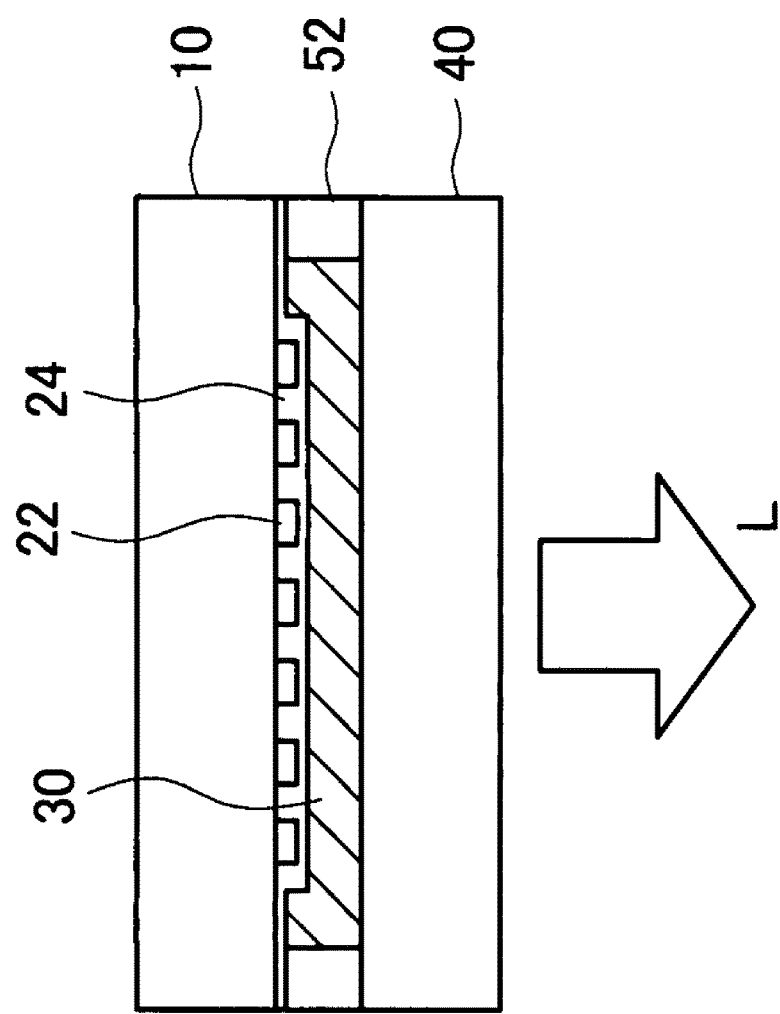

ORGANIC EL DISPLAY PROVIDED WITH GEL-STATE ENCAPSULANT INCORPORATING A DESICCANT AND A HIGH MOLECULAR-WEIGHT MEDIUM

CROSS-REFERENCE TO RELATED APPLICATION

This application is a Continuation of U.S. application Ser. No. 13/067,967 filed Jul. 12, 2011, which is a Divisional of U.S. application Ser. No. 12/382,224 filed Mar. 11, 2009. Priority is claimed based on U.S. application Ser. No. 13/067,967 filed Jul. 12, 2011, which claims priority from U.S. application Ser. No. 12/382,224 filed Mar. 11, 2009, which claims priority from Japanese application JP2008-89996 filed on Mar. 31, 2008, the content of which is hereby incorporated by reference into this application.

BACKGROUND OF THE INVENTION

1. Field of the Invention

The present invention relates to an organic EL display device, and more-particularly to an organic EL display device which prevents deterioration of an organic EL layer due to moisture and exhibits excellent life characteristics.

2. Background Art

In an organic EL display device, an organic EL layer is sandwiched between a pixel electrode (lower electrode) and an upper electrode, a fixed voltage is applied to the upper electrode, and emission of light from the organic EL layer is controlled by applying a data signal voltage to the lower electrode thus forming an image. The data signal voltage is supplied to the lower electrode via a thin film transistor (TFT).

An organic EL display device is classified into a bottom-emission-type organic EL display device in which light emitted from organic EL layers is taken out in the direction of a glass substrate on which the organic EL layers and the like are formed and a top-emission-type organic EL display device in which light emitted from organic EL layers is taken out in the direction opposite to a glass substrate on which the organic EL layers and the like are formed. The top-emission-type organic EL display device has an advantage that the respective organic EL layers can ensure a large light emission area thus increasing the brightness of a display.

When moisture is present in an organic EL material used in an organic EL display device, the light emission characteristic is deteriorated and hence, when the organic EL display device is operated for a long time, portions of the organic EL material which are deteriorated with moisture do not emit light. These portions appear as dark spots on a display region. The dark spots grow with time and become a defect of an image.

To prevent the generation or the growth of the dark spots, it is necessary to prevent the intrusion of moisture into the organic EL display device or to remove the intruded moisture from the organic EL display device. Accordingly, an element substrate on which an organic EL layer is formed is sealed by a sealing substrate thus preventing the intrusion of moisture into the inside of the organic EL display device from the outside. On the other hand, to remove moisture intruded into the inside of the organic EL display device, a desiccant is arranged in the inside of the organic EL display device. This organic EL display device is referred to as a hollow-sealed-type organic EL display device.

The hollow-sealed-type organic EL display device has drawbacks such as difficulty in adjusting a gap between the element substrate and the sealing substrate and difficulty in adjusting pressure in a sealed space inside the organic EL display device. For example, the sealing material is made of an ultra violet-ray curing epoxy resin. This resin cannot completely interrupt the intrusion of moisture from the outside and hence, the intruded moisture is diffused in a hollow portion. Accordingly, it is difficult to effectively protect an organic EL layer from moisture in case of the hollow-sealed-type organic EL display device.

To cope with such drawbacks attributed to the hollow sealed structure, there has been known a solid sealing technique which is disclosed in JP-A-2004-157517 (patent document 1). The solid sealing technique is a technique in which a space defined between an element substrate and a sealing substrate is filled with a liquid or a solid body such as an adhesive material. Patent document 1 discloses the constitution in which the element substrate and the sealing substrate which has a recessed portion are laminated to each other and, thereafter, a space defined between the element substrate and the sealing substrate is filled with silicone oil. Since silicone oil works as a stress buffering material, the substrate is hardly broken even when the substrate is curved or warped by an external force.

However, even when silicone oil is dehydrated for a long time, it is difficult to dehydrate silicone oil to an extent that silicone oil is practically applicable to an organic EL display device and hence, with a lapse of time, moisture in silicone oil precipitates and intrudes into an organic EL layer thus lowering a lifetime of the element.

JP-A-2005-533319 discloses another related art of the solid sealing structure. To before specific, a desiccant is supplied in a state where the desiccant is dissolved in an adhesive organic solvent, and a chemical reaction is generated by heat or light thus making an element substrate and a sealing substrate adhered to each other.

The technique disclosed in patent document 1 has following drawbacks. That is, the technique uses a liquid as a desiccant and hence, the technique requires the structure for injecting the liquid in the inside of the organic EL display device. Further, the technique requires a liquid injecting process and hence, manufacturing steps become complicated.

On the other hand, the technique disclosed in patent document 2 has following drawbacks. That is, when the desiccant is supplied in a sol state where the desiccant is impregnated in a low-molecular organic solution used as an adhesive material, an organic solvent is vigorously evaporated. The vigorous evaporation of the organic solvent implies that an adhesive strength is strong. The rapid evaporation, on the other hand, implies that an organic gas is liable to remain in the organic solvent correspondingly. This organic gas, as a result, shortens a lifetime of the organic EL display device. Accordingly, in the related art, it is necessary to form a silicon nitride film having a large thickness as a background film of a desiccant containing adhesive material. Further, there also exists a drawback that the solvent having low viscosity such as a solvent in a sol state is difficult to handle.

SUMMARY OF THE INVENTION

According to one aspect of the present invention, there is provided an organic EL display device which includes: a first substrate on which organic EL layers are formed in a matrix array; a second substrate which faces the first substrate in an opposed manner; and a sealing material which is formed in an annular shape between inner peripheries of the first substrate and the second substrate, wherein a gel which is formed by mixing a desiccant in a medium having a molecular weight of not less than 1,000 is filled in a space defined inside the sealing material.

According to another aspect of the present invention, there is provided an organic EL display device which includes: a first substrate on which pixels each of which has an organic EL layer sandwiched between an upper electrode and a lower electrode are formed in a matrix array; a second substrate which is arranged to face the first substrate in an opposed manner; and a sealing material which is formed in an annular shape between inner peripheries of the first substrate and the second substrate, wherein a protective film is formed above the upper electrode, and a gel which is formed by mixing a desiccant into a medium having a molecular weight of not less than 1,000 is filled in a space defined between the protective film formed on the first substrate and the second substrate and inside the sealing material.

According to still another aspect of the present invention, there is provided a manufacturing method of an organic EL display device which includes a first substrate on which organic EL layers are formed in a matrix array, a second substrate which faces the first substrate in an opposed manner, and a sealing material which is formed in an annular shape between inner peripheries of the first substrate and the second substrate, wherein the manufacturing method of an organic EL display device includes: a first step of forming a sealing material made of an ultraviolet-ray curing resin in an annular shape on the periphery of the second substrate, and forming a half-cured sealing material by radiating ultraviolet rays to the sealing material; a second step of arranging a gel-state desiccant inside the half-cured sealing material; a third step of adhering the first substrate and the second substrate, and filling a region surrounded by the first substrate, the second substrate and the sealing material with the gel-state desiccant; and a fourth step of forming the half-cured sealing material into a completely cured sealing material.

BRIEF DESCRIPTION OF THE DRAWINGS

FIG. 3A to FIG. 3C are views showing steps which follow the manufacturing step shown in FIG. 2D in the embodiment 1, wherein FIG. 3A shows the manufacturing step performed in a reduced pressure atmosphere, FIG. 3B shows the manufacturing step performed in an atmospheric-pressure atmosphere, and FIG. 3C shows the manufacturing step for curing a sealing material;

FIG. 4 is a schematic cross-sectional view of the organic EL display device of the embodiment 1;

FIG. 5 is a cross-sectional view of a display region of an organic EL display device of an embodiment 2;

FIG. 6B shows the manufacturing step performed in an atmospheric-pressure atmosphere, and FIG. 6C shows the manufacturing step for curing a sealing material; and FIG. 7 is a schematic cross-sectional view of the organic EL display device of the embodiment 2.

DESCRIPTION OF THE PREFERRED EMBODIMENT

Figure 1:
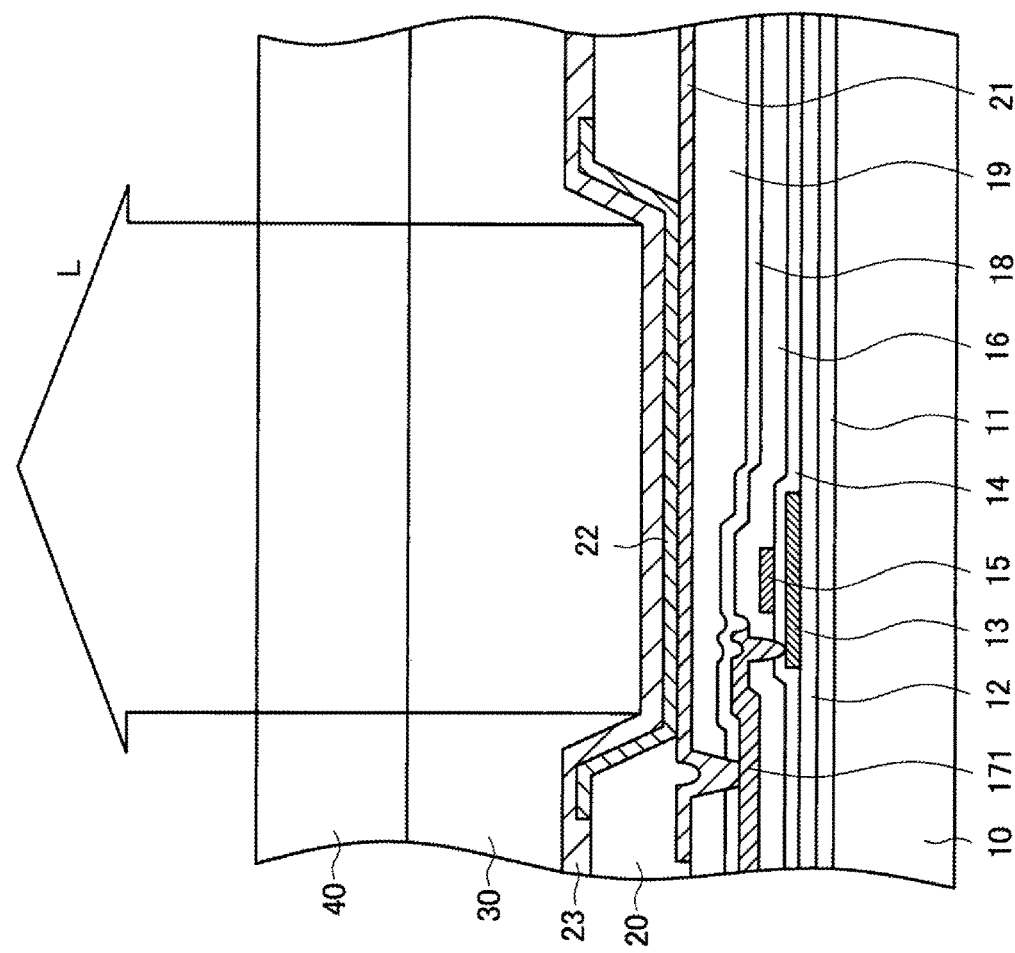
FIG. 1 is a cross-sectional view of a display region of an organic EL display device of an embodiment 1 according to the present invention.

To explain the specific constitutions of the present invention to overcome the above-mentioned drawbacks, they are as follows.

(1) In an organic EL display device which includes: a first substrate on which organic EL layers are formed in a matrix array; and a second substrate which faces the first substrate in an opposed manner, a sealing material is formed in an annular shape on the peripheries of oppositely-facing surfaces of the first substrate and the second substrate. A gel which is formed by mixing a desiccant in a medium having a molecular weight of not less than 1,000 is filled in a space surrounded by the first substrate, the second substrate and the sealing material.

(2) In the organic EL display device having the constitution (1), the medium has a molecular weight of not less than 1,000 and not more than 10,000.

(3) In the organic EL display device having the constitution (1), the sealing material is made of an ultraviolet-ray curing.

(4) In an organic EL display device which includes: a first substrate on which pixels each of which has an organic EL layer sandwiched between an upper electrode and a lower electrode are formed in a matrix array; and a second substrate which is arranged to face the first substrate in an opposed manner; wherein a sealing material is formed in an annular shape on the peripheries of oppositely-facing surfaces of the first substrate and the second substrate. A protective film is formed above the upper electrode. Further, a gel which is formed by mixing a desiccant into a medium having a molecular weight of not less than 1,000 is filled in a space surrounded by the protective film formed on the first substrate, the second substrate and the sealing material.

(5) In the organic EL display device having the constitution (4), the medium has a molecular weight of not less than 1,000 and not more than 10,000.

(6) In the organic EL display device having the constitution (4), the protective film is formed of an SiN film.

(7) In a manufacturing method of an organic EL display device which includes a first substrate on which organic EL layers are formed in a matrix array, a second substrate which faces the first substrate in an opposed manner, and a sealing material which is formed in an annular shape between inner peripheries of the first substrate and the second substrate, the manufacturing method of an organic EL display device includes: a first step of forming a sealing material made of an ultraviolet-ray curing resin in an annular shape on the periphery of the second substrate, and forming a half-cured sealing material by radiating ultraviolet rays to the sealing material; a second step of arranging a gel-state desiccant inside the half-cured sealing material; a third step of adhering the first substrate and the second substrate, and filling a region surrounded by the first substrate, the second substrate and the sealing material with the gel-state desiccant; and a fourth step of forming the half-cured sealing material into a completely cured sealing material.

(8) In the manufacturing method of an organic EL display device having the constitution (7), in the third step, the first substrate and the second substrate are laminated to each other in a reduced pressure atmosphere, and the gel-state desiccant is filled in the region surrounded by the first substrate, the second substrate and the sealing material in an atmospheric-pressure atmosphere.

(9) In the manufacturing method of an organic EL display device, having the constitution (7), the first to the third steps are performed in a nitrogen atmosphere.

According to the present invention, the gel-state desiccant is filled in the space defined between the element substrate and the sealing substrate and hence, it is possible to increase a mechanical strength of the organic EL display device. Further, even when a force is applied to the element substrate of the sealing substrate from the outside, there is no possibility that the organic EL layer is brought into contact with the sealing substrate and hence, it is possible to prevent the generation of dark spots attributed to contacting of the organic EL layer with the scaling substrate.

Further, the space defined between the element substrate and the sealing substrate is filled with the gel-state desiccant and hence, moisture hardly intrudes into the space from the outside. Further, even when moisture intrudes into the space from the outside, the moisture is absorbed by the gel-state desiccant and hence, it is possible to prolong a lifetime of the organic EL display device.

Further, since the gel-state desiccant used in the present invention is in a gel state, if is possible to prevent the occurrence of coating mottles or non-uniform drying which is observed when a transparent desiccant is applied by coating.

Further, the gel-state desiccant is used in the present invention, it is unnecessary to form a recessed portion for placing a desiccant in the sealing substrate and hence, it is possible to realize the reduction in a manufacturing cost of the sealing substrate leading to the reduction in a manufacturing cost of the organic EL display device.

Hereinafter, the present invention is explained in detail in conjunction with embodiments.

Embodiment 1

FIG. 1 is a cross-sectional view of a display region of a top-emission-type organic EL display device to which the present invention is applied. Although this embodiment is explained by taking the top-emission-type organic EL display device as an example, the present invention is also applicable to a bottom-emission type organic EL display device in the same manner. The top-emission-type organic EL display device can be classified into a top-anode-type organic EL display device in which an anode is arranged above an organic EL layer 22 and a top-cathode-type organic EL display device in which a cathode is arranged above an organic EL layer 22. Although FIG. 1 shows the top-anode type organic EL display device, the present invention is also applicable to the top-cathode type organic EL display device in the same manner.

As shown in FIG. 1, a first background film 11 made of SiN and a second background film 12 made of $SiO_2$ are formed on an element substrate 10. These background films 11, 12 are provided for preventing impurities from a glass substrate from contaminating a semiconductor layer 13. The semiconductor layer 13 is formed on the second background film 12. In forming the semi-conductor layer 13, an a-Si film is firstly formed by a CVD method and, thereafter, the a-Si film is transformed into a poly-Si film by radiating laser beams to the a-Si film.

A gate insulation film 14 made of $SiO_2$ is formed so as to cover the semiconductor layer 13. A gate electrode 15 is formed in a state that the gate electrode 15 faces the semiconductor layer 13 in an opposed manner with the gate insulation film 14 sandwiched therebetween. Using the gate electrode 15 as a mask, the semiconductor layer 13 is doped with impurities such as phosphorus or boron by ion implantation so as to make the semiconductor layer 13 conductive thus forming a source portion or a drain portion in the semiconductor layer 13.

An interlayer insulation film 16 made of $SiO_2$ is formed so as to cover the gate electrode 15. The inter layer insulation film 16 is provided for ensuring the insulation between gate lines and drain lines 171. The drain line 171 is formed on the interlayer insulation film 16. The drain line 171 is connected with the drain of the semiconductor layer 13 via a through hole formed in the interlayer insulation film 16 and the gate insulation film 14. Here, since the organic EL display device uses thin film transistors, as a matter of course, the structure shown in FIG. 1 requires a source electrode. However, the source electrode is not shown in FIG. 1.

Thereafter, to protect a thin film transistor (TFT) formed in the above-mentioned manner, an inorganic passivation film 18 made of SiN is formed on the interlayer insulation film 16, the thin film transistors and the drain lines 171 by coating. An organic passivation film 19 is formed on the inorganic passivation film 18. The organic passivation film 15 plays a role of protecting the TFT more completely together with the inorganic passivation film 18. The organic passivation film 19 also plays a role of leveling a surface on which an organic EL layer 22 is formed. Accordingly, the organic passivation film 19 is formed with a large thickness of 1 to 4 μm.

A reflection electrode made of Al or Al alloy is formed on the organic passivation film 13. Since Al or Al alloy exhibits high reflectance, Al or Al alloy is preferably used as a material of the reflection electrode. The reflection electrode is connected with the drain line 171 via a through hole formed in the organic passivation film 19 and the inorganic passivation film 18.

This embodiment provides the top-anode-type organic EL display device and hence, a lower electrode 21 of the organic EL layer 22 constitutes a cathode. Accordingly, the Al layer or Al alloy layer which is used for forming the reflection electrode is also used for forming the lower electrode 21 of the organic EL layer 22. This is because Al or Al alloy possesses a relatively small work function and hence, Al or Al alloy can function as cathodes.

The organic EL layer 22 is formed on the lower electrode 21. The organic EL layer 22 is constituted of an electron transport layer, a light emission layer and a hole transport layer which are laminated from below. Here, an electron injection layer may be interposed between the electron transport layer and the lower electrode 21. Further, a hole injection layer may be interposed between the hole transport layer and an upper electrode 23. The upper electrode 23 which constitutes an anode is formed on the organic EL layer 22. In this embodiment, the upper electrode 23 is made of IZO. The IZO film is formed over the whole display region by vapor deposition without using a mask. A thickness of the IZO film is set to approximately 30 nm for maintaining optical transmissivity. An ITO film may be used in place of the IZO film.

A material which can be used as an electron-transport-layer material is not specifically limited provided that the material exhibits electron transport property and can be easily formed into a charge-transfer complex by co-deposition with alkali metal and, for example, a metal complex such as tris (8-quinolinolato) aluminum, tris (4-methyl-8-quinolinolato) aluminum, bis (2-methyl-8-quinolinolato)-4- phenylphenolato-aluminum, bis [2-[2-hydroxyphenyl]benzooxazolato]zinc, 2-(4-biphenylyl)-5-(4-tert-butylphenyl)-1,3,4-oxadiazol, 1,3-bis [5-(p-tert-butylphenyl)-1,3,4-oxadiazol-2-yl]benzene or the like can be used.

A material which can be used as a light-emitting-layer material is not specifically limited provided that the material is made of a host material having an electron-and-hole transporting ability to which a dopant which emits a fluorescent light or a phosphorus light by re-coupling thereof is added and the material forms a light emitting layer by co-vapor-deposition. For example, as the host material, a complex such as tris (8-quinolinolato) aluminum, bis (8-quinolinolato) magnesium, bis (benzo{f}-8-quinolinolato) zinc, bis (2-methyl-8-quinolinolato) aluminum oxide, tris (8-quinolinolato) indium, tris (5-methyl-8-quinolinolato) aluminum, 8-quinolinolato lithium, tris (5-chloro-8-quinolinolato) gallium, bis (5-chloro-8-quinolinolato) calcium, 5,7-dichloro-8-quinolinolato aluminum, tris (5,7-dibromo-8-hydroxyquinolinolato) aluminum, and poly [zinc(II)-bis(8-hydroxy-5-quinolinyl) methane], an anthracene derivative, a carbazole derivative, or the like can be used.

Further, the dopant may be a material which captures electrons and holes in a host material and emits light by re-coupling. For example, the red dopant may be formed of a pyran derivative, the green dopant may be formed of a coumarin derivative, and the blue dopant may be formed of a substance which emits fluorescent light such as an anthracene derivative or a substance which emits phosphorescence such as an iridium complex and a pyridinato derivative.

The hole transport layer may be made of, for example, a tetraaryl benzidine compound (triphenyl diamine: TPD), aromatic tertiary amine, a hydrazone derivative, a carbazole derivative, a triazole derivative, an imidazole derivative, an oxadiazole derivative having an amino group, a polythiophene derivative, a copper phthalocyanine derivative or the like.

Here, to prevent the organic EL layer 22 from being broken at an edge portion thereof due to a broken step, a bank 20 is formed between the pixels. The bank 26 may be formed of an organic material, or the bank 20 may be formed of an inorganic material such as SiN. In forming the bank 20 using the organic material, in general, an acrylic resin is used.

An auxiliary electrode may be formed on the upper electrode which is formed on the bank 20 for assisting the electrical conduction of the upper electrode. This is because when the resistance of the upper electrode is large, brightness irregularities may occur. Although the auxiliary electrode is not used in this embodiment, it is needless to say that the present invention is also applicable to an organic EL display device which uses the auxiliary electrode.

In FIG. 1, a gel-state desiccant 30 for protecting the organic EL layer from moisture is sandwiched between the upper electrode of the element substrate 10 and the sealing substrate 40. In the present invention, the gel-state desiccant 30 is used as a desiccant. The gel-state desiccant 30 is formed by dispersing a desiccant in a gel-state material. The gel-state desiccant 30 is flexibly deformed when a force is applied from the outside while keeping a solid state. According to the present invention, by making use of the flexibility of the gel-state desiccant 30, the desiccant is uniformly filled up in a apace defined between the element substrate 10 and the sealing substrate 40 without forming a gap. As a gel-state material for forming the gel-state desiccant 30, a resin which is referred to as dendrimer whose molecular weight is not less than 1000 and not more than 10000 can be suitably used. As the desiccant which is dispersed in the gel-state material, silica gel, alcoholate or the like can be used. The sealing substrate 40 which sandwiches the gel-state desiccant 30 with the element substrate 10 is formed of a glass sheet, and the glass sheet has a thickness of approximately 0.5 mm.

Figure 2A:
FIG. 2A to FIG. 2D are views showing steps of a sealing-substrate-side process in a manufacturing method of the organic EL display device of the embodiment 1 according to the present invention.

FIG. 2A, FIG. 2B, FIG. 2C and FIG. 2D are views showing steps of a sealing-substrate-40-side process in a manufacturing method of the organic EL display device according to the present invention. FIG. 2A shows the sealing substrate 40 which is formed of a glass sheet. The sealing substrate 40 is formed of a flat glass sheet. In a related art, in placing the desiccant on the sealing substrate 40, a recessed portion is formed in a portion of the sealing substrate 40 on which the desiccant is placed by sand blasting or the like. However, since the present invention uses the gel-state desiccant 30, it is unnecessary to form such a recessed portion in the sealing glass substrate. This is because a sealing material formed on the periphery of the sealing substrate 40 works as a stopper for the gel-state desiccant 30 as described below.

To the periphery of the sealing substrate 40, a sealing material 50 is applied by coating using a dispenser. The sealing material 50 is formed in a loop shape with no opening portion. The sealing material 50 is made of an ultraviolet-ray curing resin. Coating of the sealing material 50 using the dispenser is performed in a nitrogen atmosphere.

Figure 2B:
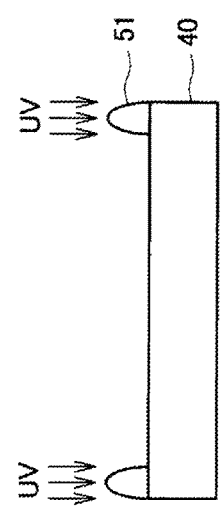

The sealing material 50 applied to the periphery of the sealing substrate 40 by coating using the dispenser has fluidity although the viscosity of the sealing substrate 50 is high. Accordingly, as shown in FIG. 2B, ultraviolet rays are radiated to the sealing material 50 which is formed on the periphery of the sealing substrate 40 to form a half-cured sealing material 51. In a stage which comes later, the sealing substrate 40 and the element substrate 10 are adhered to each other and, thereafter, the sealing material 50 is formed into a completely-cured sealing material 52. Accordingly, at this paint of time, the sealing material 50 is held as the half-cured sealing material 51.

Figure 2C:
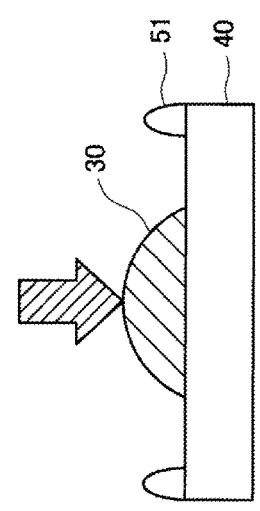

Thereafter, as shown in FIG. 2C, the gel-state desiccant 30 is dropped in a space defined inside the half-cured sealing material 51 which is formed in a loop shape. Usually, the gel-state desiccant 30 is dropped in a gel state. However, when it is difficult to drop the gel-state desiccant 30 because of viscosity of the gel-state desiccant 30, the gel-state desiccant 30 may be applied by coating in a state where the gel-state desiccant 30 is dissolved in a low molecular solvent. Also in this case, the half-cured sealing material 51 formed on the periphery of the sealing substrate 40 becomes a stopper for the low molecular solvent in which the gel-state desiccant 30 is dissolved. When the gel-state desiccant 30 is made of dendrimer and the dendrimer has a chemical polarity, the dendrimer can be easily dissolved in the low molecular solvent and hence, dendrimer can be easily dropped into the space defined inside the half-cured sealing material 51. Here, the chemical polarity implies that, when the molecular structure has the chain structure, the molecular structure differs between a left end and a right end thereof.

When a required amount of the solvent in which the gel-state desiccant 30 is dissolved is dropped in the space defined inside the half-cured sealing material 51, the low molecular solvent in the solvent is immediately evaporated and the applied solvent returns to a state of the gel-state desiccant 30. The evaporation of the low molecular solvent is so fast that the low molecular solvent is dissipated before a step of adhering the sealing substrate 40 and the element substrate 10 to each other.

Figure 2D:
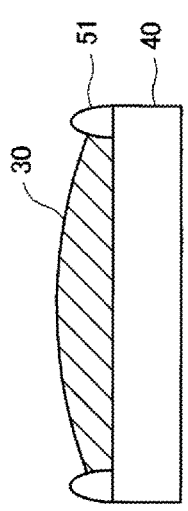

FIG. 2D shows a state where the gel-state desiccant 30 is applied to the sealing substrate 40 in the above-mentioned manner. As shorn in FIG. 2D, the gel-state desiccant 30 is in a gel state and hence, the gel-state desiccant 30 does not assume a fixed solid state even after the gel-state desiccant 30 is applied to the sealing substrate 40 by coating, and an upper surface of the gel-state desiccant 30 is not flattened and, for example, forms a gentle mount. Here, all steps shown in FIG. 2A to FIG. 2D are performed in a nitrogen atmosphere.

As shown in FIG. 2D, although the sealing substrate 40 to which the gel-state desiccant 30 is applied by coating is in the nitrogen atmosphere, by reducing the pressure in the atmosphere, air bubbles 60 or the like contained in the gel-state desiccant 30 are removed. At this point of time, the low molecular solvent which is not removed heretofore is completely removed.

Figure 3A:
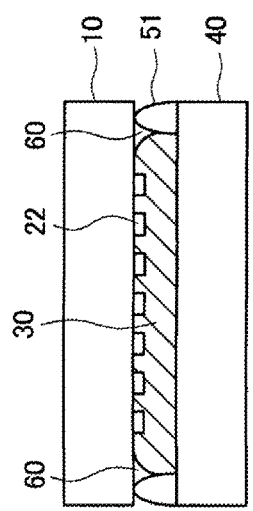

To the sealing substrate 40 from which the bubbles are removed in the above-mentioned manner, the element substrate 10 is adhered. The adhering operation is also performed in the reduced-pressure atmosphere. This state is shown in FIG. 3A. In FIG. 3A, to prevent the drawing from becoming complicated, only the organic EL layer is described on the element substrate 10. In the state shown in FIG. 3A, the sealing substrate 40 and the element substrate 10 are merely adhered to each other. Accordingly, the bubbles 60 or the like are present between the gel-state desiccant 30 in the space defined inside the half-cured sealing material 51 and the element substrate 10.

Thereafter, nitrogen is supplied to the ambient atmosphere in which the sealing substrate 40 and the element substrate 10 are adhered to each other so as to return the pressure of the ambient atmosphere to an atmospheric pressure. In this manner, the element substrate 10 and the sealing substrate 40 are pushed by the atmospheric pressure and hence, the bubbles 60 which are present between the sealing substrate 40 and the element substrate 10 are eliminated or dissipated. Further, since the element substrate 10 and the sealing substrate 40 are pushed from above and below, the half-cured sealing material 51 also collapses and is deformed into a shape which provides the more reliable sealing between the element substrate 10 and the sealing substrate 40. This state is shown in FIG. 3B.

Figure 3B:
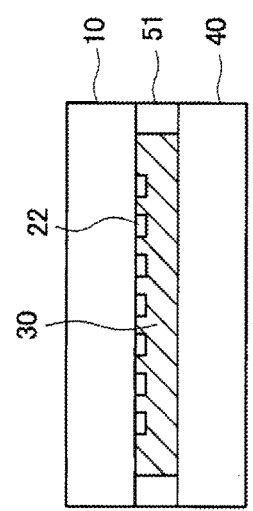

In FIG. 3B, the inner space surrounded by the element substrate 10, the sealing substrate 40 and the half-cured sealing material 51 is filled up with the gel-state desiccant 30 without forming a gap and hence, no air bubbles 60 or the like are present in the inner space. That is, since the gel-state desiccant 30 is in a gel state, the gel-state desiccant 30 is not completely solid and hence, the gel-state desiccant 30 can be flexibly filled in the gap. Further, various layers are formed on the element substrate 10 so that a surface of the element substrate 10 becomes uneven when viewed microscopically. However, the gel-state desiccant 30 can flexibly conform to such an uneven surface and is filled in the concave portions of the uneven surface.

Figure 3C:
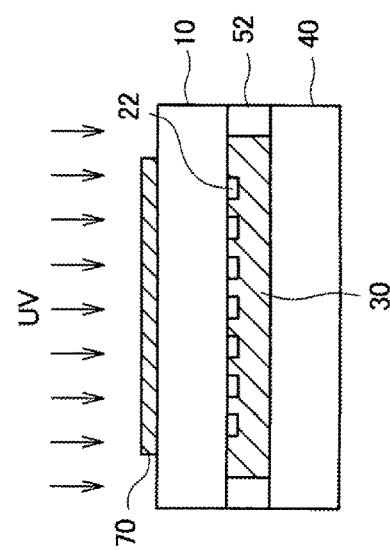

In a state shown in FIG. 3B, the half-cured sealing material 51 is hot in a completely cured state and hence, the adhesion between the element substrate 10 and the sealing substrate 40, the sealing reliability and the like are not sufficiently ensured. Accordingly, as shown in FIG. 3C, ultraviolet rays are radiated to the sealing material 50 so as to bring the sealing material 50 into a cured sealing material 52 which is completely cured. Here, the cured sealing material 52 may be cured to an extent that the cured sealing material 52 can adhere the sealing substrate 40 and the element substrate 10 to each other and the adhesion is maintained with reliability. On the other hand, when ultraviolet rays are radiated to the organic EL layers, the organic EL layers are broken. Accordingly, in FIG. 3C, an ultraviolet-ray cover 70 is arranged on a portion of the element substrate 10 where the organic EL layers are formed thus allowing ultraviolet rays to be radiated only to the sealing material 50 portion.

Here, in FIG. 3C, ultraviolet rays are radiated to the half-cured sealing material 51 so as to form the half-cured sealing material 51 into the cured sealing material 52. However, in forming the half-cured sealing material 51 into the cured sealing material 52, depending on a material to be used for forming the sealing material, besides the radiation of ultraviolet-rays, the half-cured sealing material 51 may be formed into the cured sealing material 52 also by heating. In this case, it is necessary to set a heating temperature to a value which falls within a range which does not cause breaking of the organic EL layers.

While FIG. 3C shows a state where the sealing portion is formed of the cured sealing material 52 by radiating ultraviolet rays, FIG. 4 shows a state of a next step where the ultraviolet-ray cover 70 is removed. That is, FIG. 4 is a schematic cross-sectional view showing a state of the organic EL display device of this embodiment in a completed state. In FIG. 4, light emitted from the organic EL layers is radiated toward the sealing substrate 40 side, that is, in the direction indicated by an arrow L shown in FIG. 4. The gel-state desiccant 30 which is filled between the element substrate 10 and the sealing substrate 40 is flexibly filled in a boundary portion between the gel-state desiccant 30 and the sealing substrate 40 and hence, even when the light passes the gel-state desiccant 30 and is taken out from the sealing substrate 40 side, the gel-state desiccant 30 does not hamper the formation of an image.

As shown in FIG. 4, surfaces of the organic EL layers are completely covered with the gel-state desiccant 30. Further, the space defined between the element substrate 10 and the sealing substrate 40 is filled with the gel-state desiccant 30 and hence, a mechanical strength of the organic EL display device is enhanced. Accordingly, even when a force is applied to the element substrate 10 or the sealing substrate 40 from the outside, the gel-state desiccant 30 can prevent the organic EL layer and the sealing substrate 40 from being brought into contact with each other.

Further, according to the constitution of the present invention, the gel-state desiccant 30 is filled in the space defined between the element substrate 10 and the sealing substrate 40 and hence, different from the constitution of a hollow-sealed-type organic EL display device, moisture hardly intrudes into the inside of the organic EL display device from the outside. Still further, even when moisture intrudes into the inside of the organic EL display device from the outside, moisture is absorbed by the gel-state desiccant 30 and hence, the organic EL display device of the present invention can enjoy a long lifetime.

Further, the gel-state desiccant 30 of the present invention is in a gel state and hence, compared to a conventional case in which a desiccant is applied by coating, coating mottles or non-uniform drying hardly occurs.

Further, according to the present invention, the gel-state desiccant 30 is placed on the sealing substrate 40 using the sealing material 50 as a stopper. On the other hand, in a related art, in placing a solid desiccant on the sealing substrate 40, a recessed portion is formed in the sealing substrate 40 and a desiccant is placed in the recessed portion. Accordingly, in the related art, it is necessary to form the recessed portion in the sealing substrate 40 by sand blasting or the like and hence, a manufacturing cost of the sealing substrate 40 is pushed up. According to the present invention, a flat plate may be used for forming the sealing substrate 40 and hence, the increase in manufacturing costs of the sealing substrate 40 can be suppressed.

Heretofore, the explanation has been made with respect to the case in which the single organic EL display device is manufactured independently. However, in the actual manufacture of the organic EL display devices, from a viewpoint of enhancement of manufacturing efficiency, the organic EL display devices are manufactured as follows. A large mother element substrate on which a plurality of element substrates 10 is formed and a large mother sealing substrate on which a plurality of sealing substrates 40 is formed are laminated to each other so as to form a plurality of organic EL display devices. Thereafter, the laminated structure is divided into individual organic EL display devices. The present invention is also applicable to the organic EL display devices which are manufactured by such a manufacturing process.

Embodiment 2

FIG. 5 is a cross-sectional view of a display part of an organic EL display device according to an embodiment 2 of the present invention. In FIG. 5, the structure up to the upper electrode from the element substrate 10 of this embodiment is equal to the corresponding structure shown in FIG. 1. In the structure shown in FIG. 5, a protective film 24 is formed on the upper electrode. The gel-state desiccant 30 protects the organic EL layer by absorbing moisture intruded from the outside. However, it is desirable that even when the moisture-absorbing property of the gel-state desiccant 30 becomes insufficient, such a state does not cause an immediate malfunction of the organic EL display device and the organic EL display device continues an operation thereof for a predetermined time.

In this embodiment, by forming the protective film 24 which prevents the intrusion of moisture on a surface of the upper electrode, even when the moisture absorbing property of the gel-state desiccant 30 becomes insufficient, the organic EL display device can perform an operation thereof for a predetermined time. Due to such constitution, the organic EL display device can ensure a more prolonged lifetime than the organic EL display device of the embodiment 1.

The protective film 24 is formed of an SiN film. Although the protective film 24 is formed of an $SiN_x$ film in many cases in the actual manufacture of the organic EL display device, the protective film 24 is formed of the SiN film as a representative example. The SiN film may be formed by various methods. In this embodiment, the protective film 24 is formed after the formation of the organic EL layer. Since the organic EL layer is broken at a high temperature, it is impossible to form the SiN film at a high temperature. In this embodiment, the SiN film is formed by a low-temperature CVD method. In the low-temperature CVD method, a film can be formed at a temperature of not more than 200° C. Further, in this case, temperature of the element substrate 10 can be held at a temperature of approximately 80° C.

In FIG. 5, the gel-state desiccant 30 is sandwiched between the protective film 24 of the element substrate 10 and the sealing substrate 40. In the embodiment shown in FIG. 5, the organic EL display device is, in the same manner as the embodiment 1, a top-emission-type organic EL display device in which light from the organic EL layer is radiated in the direction indicated by an arrow L shown in FIG. 5.

A manufacturing method of the sealing substrate 40 used in this embodiment is substantially equal to the manufacturing method shown in FIG. 2 which is explained in conjunction with the embodiment 1. The whole process shown in FIG. 2 is performed in a nitrogen atmosphere.

Figure 6A:
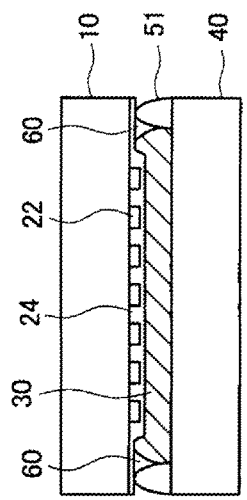
FIG. 6A to FIG. 6C are views showing steps of the embodiment 2, where in FIG. 6A shows the manufacturing step performed in a reduced pressure atmosphere.

To the sealing substrate 40 which is formed by the process shown in FIG. 2, the element substrate 10 which is formed separately from the sealing substrate 40 is laminated. The laminated structure constituted of the sealing substrate 40 and the element substrate 10 is shown in FIG. 6A. The process shown in FIG. 6A is equal to the process of the embodiment 1 shown in FIG. 3A except for that the protective film 24 is formed on the element substrate 10. The process shown in FIG. 6A is performed in a pressure-reduced nitrogen atmosphere.

Figure 6B:
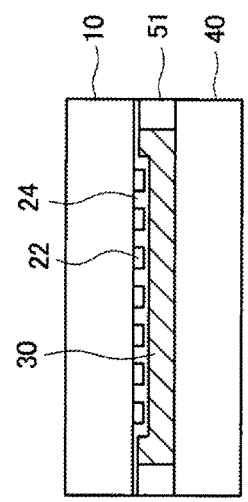

FIG. 6B is a view which shows steps in which nitrogen is supplied to the ambient atmosphere in which the sealing substrate 40 is laminated to the element substrate 10 in a pressure-reduced state shown in FIG. 6A, and an atmospheric pressure is applied to the element substrate 10 and the sealing substrate 40 so as to eliminate bubbles 60 or the like in the inside of the laminated structure. The process shown in FIG. 6B is substantially equal to the process of the embodiment 1 shown in FIG. 3B.

Thereafter, ultraviolet rays are radiated to the half-cured sealing material 51 so as to make the adhesion between the element substrate 10 and the sealing substrate 40 complete and, at the same time, to enhance the sealing property. This process is also substantially equal to the process of the embodiment 1 shown in FIG. 3C.

Figure 6C:
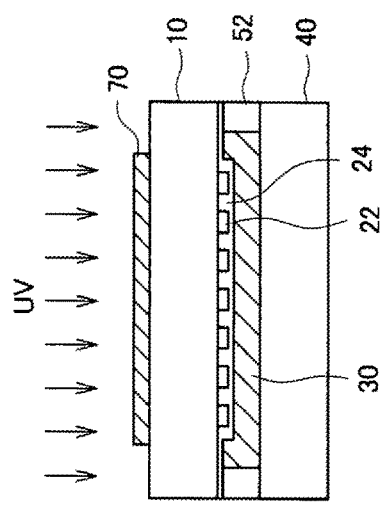

Further, in FIG. 6C, ultraviolet rays are radiated to the half-cured sealing material 51 so as to form the half-cured sealing material 51 into the cured sealing material 52 which is completely cured. However, in forming the half-cured sealing material 51 into the cured sealing material 52, depending on a material to be used for forming the sealing material, besides the radiation of ultraviolet rays, the half-cured sealing material 51 may be formed into the cured sealing material 52 also by heating. In this case, it is necessary to set a heating temperature to a value which falls within a range which does not cause breaking of the organic EL layers.

FIG. 7 is a cross-sectional view of the organic EL display device of the embodiment 2 which is completed by removing the ultraviolet-ray cover 70. In FIG. 7, the light emitted from the organic EL layers is radiated in the direction indicated by an arrow L. The constitution shown in FIG. 7 is substantially equal to the constitution shown in FIG. 4 which is a cross-sectional view of the embodiment 1 except for that the protective film 24 is formed on surfaces of the organic EL layers. In FIG. 7, the gel-state desiccant 30 is filled in the space defined between the protective film 24 of the element substrate 10 and the sealing substrate 40 without forming a gap. Accordingly, even when an external force is applied to the sealing substrate 40 or the element substrate 10, it is possible to prevent the organic EL layer and the sealing substrate 40 from being brought into contact with each other.

Further, also in this embodiment, the gel-state desiccant 30 is filled in the space defined between the sealing substrata 40 and the element substrate 10 and hence, the organic EL display device of this embodiment can also acquire various advantageous effects including the following advantageous effects in the same manner as the embodiment 1. That is, moisture hardly intrudes into the inside of the organic EL display device from the outside. A mechanical strength of the organic EL display device can be enhanced. It is unnecessary to form a recessed portion or the like in the sealing substrate 40 and hence, a flat plate can be used for forming the sealing substrate 40.

In FIG. 7, the organic EL layer is covered with the protective film 24. Accordingly, even when the moisture absorbing property of the gel-state desiccant 30 is lowered, the organic EL display device of this embodiment can be operated for a considerably long time and hence, life characteristics of the organic EL display device can be enhanced. Further, the protective film 24 can block moisture which intrudes along an interface between the gel-state desiccant 30 and the element substrate 10. Also due to such constitution, the organic EL display device of this embodiment can exhibit excellent life characteristics.

In FIG. 7, the explanation has been made with respect to the case in which the protective film 24 is formed of the single-layered SiN film. However, the protective film 24 of this embodiment is not necessarily limited to such single-layered structure and the protective film 24 may be formed of a plurality of films. The protective film 24 is made of SiN in this embodiment. However, a material of the protective film is not limited to SiN and the protective film 24 may be made of $SiO_2$ or the like. Further, the protective film 24 may be formed of a combination of ah SiN film and an $SiO_2$ film.

Heretofore, the explanation has been made with respect to the case in which the single organic EL display device is manufactured independently. However, in the actual manufacture of the organic EL display devices, from a viewpoint of enhancement of manufacturing efficiency, the organic EL display devices are manufactured as follows. A large mother element substrate on which a plurality of element substrates 10 is formed and a large mother sealing substrate on which a plurality of sealing substrates 40 is formed are laminated to each other so as to form a plurality of organic EL display devices. Thereafter, the laminated structure is divided into individual organic EL display devices. This embodiment is also applicable to the organic EL display devices which are manufactured by such a manufacturing process in the same manner as the embodiment 1.

What is claimed is:

1. An organic EL display device comprising:
a first substrate having a display region which includes a plurality of pixels and a peripheral region which surrounds the display region, each of the plurality of pixels having a pixel electrode and an organic EL layer formed on the pixel electrode;
a second substrate facing the first substrate;
an upper electrode formed on the organic EL layer;
a resin sandwiched between the first substrate and the second substrate; and
a protective film is formed of inorganic material and covering the upper electrode,
wherein the protective film over the peripheral region is being thinner than the protective film over the display region, and
the upper electrode is in direct contact with the protective film.

2. The organic EL display device according to claim 1, wherein the protective film is formed of a plurality of inorganic layers.

3. The organic EL display device according to claim 2, wherein at least one of the plurality of inorganic layers is formed of silicon nitride.

4. The organic EL display device according to claim 2, wherein at least one of the plurality of inorganic layers is formed of silicon oxide.

5. The organic EL display device according to claim 1, wherein the resin is sandwiched between the second substrate and the protective film covering the peripheral region and the display region.

6. The organic EL display device according to claim 1, wherein the upper electrode is formed over the whole display region.

7. The organic EL display device according to claim 6, the upper electrode is made of IZO or ITO.

8. An organic EL display device comprising:
a first substrate having a display region which includes a plurality of pixels and a peripheral region which surrounds the display region, each of the plurality of pixels having a pixel electrode, and an organic EL layer formed on the pixel electrode;
a second substrate facing the first substrate;
an upper electrode formed on the organic EL layer;
a resin sandwiched between the first substrate and the second substrate; and
a protective film having more than two inorganic layers and covering the upper electrode,
wherein a total thickness of the more than two inorganic layers over the peripheral region is thinner than a total thickness of the more than two inorganic layers over the display region, and
the upper electrode is in direct contact with the protective film.

9. The organic EL display device according to claim 8, wherein at least one of the more than two inorganic layers is formed of silicon nitride.

10. The organic EL display device according to claim 8, wherein at least one of the more than two inorganic layers is formed of silicon oxide.

11. The organic EL display device according to claim 8, wherein the resin is sandwiched between the second substrate and the protective film covering the peripheral region and the display region.

12. The organic EL display device according to claim 8, wherein the upper electrode is formed over the whole display region.

13. The organic EL display device according, to claim 12, the upper electrode is made of IZO or ITO.

14. An organic EL display device comprising:
a first substrate having a display region which includes a plurality of pixels and a peripheral region which surrounds the display region, each of the plurality of pixels having a pixel electrode, and an organic EL layer formed on the pixel electrode;
a second substrate facing the first substrate; and
an upper electrode formed on the organic EL layer;
a resin sandwiched between the first substrate and the second substrate; and
an inorganic film having more than two inorganic layers and covering the upper electrode,
wherein the inorganic film over the peripheral region is thinner than the inorganic film over the display region, and
the upper electrode is in direct contact, with the inorganic film.

15. The organic EL display device according to claim 14, wherein at least one of the more than two inorganic layers is formed of silicon nitride.

16. The organic EL display device according to claim 14, wherein at least one of the more than two inorganic layers is formed of silicon oxide.

17. The organic EL display device according, to claim 14, wherein the resin is sandwiched between the second substrate and the inorganic film covering the peripheral region and the display region.

18. The organic EL display device according to claim 14, wherein the upper electrode is formed over the whole display region.

19. The organic EL display device according to claim 18, the upper electrode is made of IZO or ITO.

* * * * *